US007485926B2

(12) United States Patent
Richter et al.

(10) Patent No.: US 7,485,926 B2
(45) Date of Patent: Feb. 3, 2009

(54) SOI CONTACT STRUCTURES

(75) Inventors: Steffen Richter, Apfelstaedt (DE); Dirk Nuernbergk, Erfurt (DE); Wolfgang Goettlich, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 286 days.

(21) Appl. No.: 10/543,896

(22) PCT Filed: Jan. 30, 2004

(86) PCT No.: PCT/DE2004/000146

§ 371 (c)(1),
(2), (4) Date: Jul. 29, 2005

(87) PCT Pub. No.: WO2004/068574

PCT Pub. Date: Aug. 12, 2004

(65) Prior Publication Data

US 2006/0160339 A1    Jul. 20, 2006

(30) Foreign Application Priority Data

Jan. 30, 2003  (DE)  .................. 103 03 643

(51) Int. Cl.
*H01L 21/00*  (2006.01)

(52) U.S. Cl. ................ 257/347; 257/471; 257/306
(58) Field of Classification Search ............... 257/471, 257/347, 306
See application file for complete search history.

(56) References Cited

U.S. PATENT DOCUMENTS

| 5,241,211 A | 8/1993 | Tashiro |
| 5,479,048 A | 12/1995 | Yallup et al. |
| 5,569,621 A | 10/1996 | Yallup et al. |
| 5,610,083 A | 3/1997 | Chan et al. |
| 5,838,045 A * | 11/1998 | Muller et al. ............... 257/301 |
| 6,124,615 A | 9/2000 | Lee |
| 6,191,007 B1 * | 2/2001 | Matsui et al. ............... 438/459 |
| 6,221,738 B1 * | 4/2001 | Sakaguchi et al. .......... 438/455 |
| 6,271,541 B2 * | 8/2001 | Yamaguchi et al. ........... 257/66 |
| 6,272,736 B1 | 8/2001 | Lee |
| 6,303,414 B1 * | 10/2001 | Ang et al. .................... 438/155 |
| 6,399,460 B1 * | 6/2002 | Yamaguchi et al. ......... 438/412 |
| 6,407,429 B1 | 6/2002 | Ko et al. |
| 6,806,470 B2 * | 10/2004 | Iida et al. ................. 250/338.1 |
| 7,075,151 B2 * | 7/2006 | Shino ......................... 257/347 |

(Continued)

FOREIGN PATENT DOCUMENTS

JP    2000-012868    1/2000

(Continued)

OTHER PUBLICATIONS

English Language Abstract of JP 2000-012868.

*Primary Examiner*—Laura M Menz
(74) *Attorney, Agent, or Firm*—Greenblum & Bernstein P.L.C.

(57) ABSTRACT

Disclosed are an arrangement and a production method for electrically connecting active semiconductor structures in or on a monocrystalline silicon layer (12) located on the front face (V) of silicon-on-insulator semiconductor wafers (SOI, 10) to the substrate (13). The electrical connection (20) is made through an insulator layer (11). A stack of layers (30 to 32, 70 to 72) is disposed above the connection piece (20) on the insulator layer (11).

17 Claims, 3 Drawing Sheets

U.S. PATENT DOCUMENTS

| | | | |
|---|---|---|---|
| 7,227,264 B2 * | 6/2007 | Kato | 257/750 |
| 7,279,375 B2 * | 10/2007 | Radosavljevic et al. | 438/197 |
| 2002/0022328 A1 | 2/2002 | Ang et al. | |
| 2002/0045298 A1 | 4/2002 | Takahashi | |
| 2002/0119608 A1 | 8/2002 | Ko et al. | |
| 2002/0130347 A1 | 9/2002 | Fechner et al. | |
| 2002/0195638 A1 | 12/2002 | Fechner et al. | |
| 2004/0106247 A1 | 6/2004 | Takahashi | |
| 2005/0104134 A1 * | 5/2005 | Kato | 257/382 |
| 2005/0121710 A1 * | 6/2005 | Shino | 257/296 |
| 2006/0160339 A1 * | 7/2006 | Richter et al. | 438/570 |
| 2007/0132009 A1 * | 6/2007 | Takeuchi et al. | 257/321 |
| 2007/0235833 A1 * | 10/2007 | Cheng et al. | 257/506 |
| 2008/0017906 A1 * | 1/2008 | Pelella et al. | 257/306 |
| 2008/0048186 A1 * | 2/2008 | Cheng et al. | 257/48 |

FOREIGN PATENT DOCUMENTS

| | | |
|---|---|---|
| WO | 02/073667 | 9/2002 |

* cited by examiner

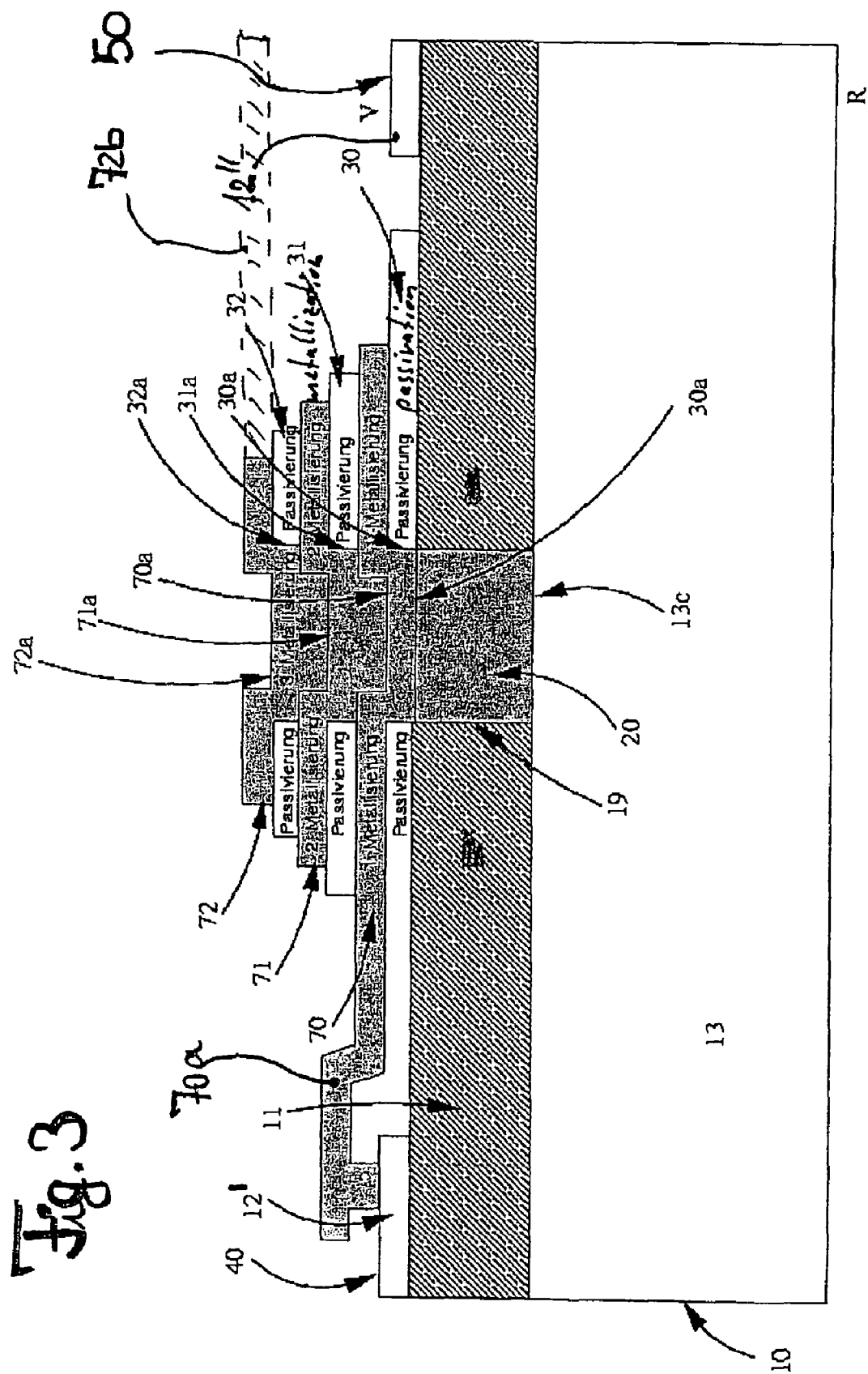

SOI CONTACT STRUCTURES

CROSS-REFERENCE TO RELATED APPLICATIONS

The present application is a U.S. National Stage of International Patent Application No. PCT/DE2004/000146 filed Jan. 30, 2004, and claims priority of German Patent Application No. 103 03 643.1 filed Jan. 30, 2003. Moreover, the disclosure of International Patent Application No. PCT/DE2004/000146 is expressly incorporated by reference herein in its entirety.

BACKGROUND OF THE INVENTION

1. Field of the Invention

The invention relates to SOI structures (silicon on insulator), in which electrical connections are provided between device structures in the upper semiconductor layer insulated from the substrate and the semiconductor substrate, which connections are formed through the insulating layer to the upper semiconductor layer.

2. Discussion of Background Information

An SOI structure consists of a thin semiconductor layer, which is located on a thin oxide layer. The oxide layer is typically formed as a buried oxide (BOX) and is also provided on a semiconductor layer, i.e., generally a silicon layer, that is, the silicon substrate, which usually has a thickness of 300 μm to 800 μm. This substrate serves the purpose of handling the structure. The actual device functions are realized in the semiconductor layer near the surface, similar to usual CMOS processes performed on homogenous silicon wafers.

A significant difference with respect to standard CMOS processes resides in the fact that the devices are dielectrically separated from each other by trenches which extend down to the insulating layer. Hereby, a mutual electrical interaction of the devices is significantly reduced. This dielectric isolation renders the SOI technology also suitable for high voltage applications.

On one hand, it is advantageous when the devices are not coupled to each other via the substrate. Thus, certain non-desired substrate effects may be avoided, such as latch-up, significant reverse currents at elevated temperatures, increased parasitic capacitances at the source/bulk or drain/bulk-pn junctions.

On the other hand, it is advantageous when a substrate connection is provided, for instance, to allow to incorporate into the circuit certain active or passive structures formed in the substrate. In this way, devices may also be integrated that are formed by different techniques not corresponding to the SOI technology. In this case, an electric contact to the substrate would be advantageous. The back side metallization of the substrate, which would be useable for this purpose is, however, not a component of the SOI technology. The corresponding packages do not provide a back side contact and, frequently, the number of pins is not sufficient in the integrated circuits so as to allow a contact to the back side or to root out such a contact.

SUMMARY OF THE INVENTION

The invention provides an electrical connection of SOI device structures within an active silicon layer to the substrate, while circumventing or avoiding a back side metallization of the substrate. Thereby, the degree of integration of circuits is to be increased. Also, devices not corresponding to the SOI technology are to be taken into consideration.

The solution of the present invention is described in the claims. Further embodiments of the invention are defined in the dependent claims. By way of example, according to the invention the insulating layer comprises through holes in areas lacking the monocrystalline semiconductor layer, said through holes extend to the substrate and are filled with metal. At least one layer stack, comprising at least two respective layers, is located on the insulating layer. The first layer represents a passivation layer having an opening above the area of the metal filling, above which the second metallization layer is located, that is connected to the metal filling and that provides the electric contact between the substrate and structures prepared on the wafer front side. By way of further example, according to the invention, the insulating layer comprises worked through portions in areas not covered by the monocrystalline semiconductor layer, and the worked through portions extend to the substrate and are filled with a metal. At least one layer sequence is formed on the insulating layer, and the layer sequence is comprised of two respective layers. From the layers, a first one is a passivation layer having an opening above the metal filling, above which is located a second layer as a metallization layer, which is conductively connected to the metal filling and which provides electrical contact or a conductive structure to the substrate so as to contact or conductively connect structures prepared on the front side with the substrate. By way of still further example, the invention includes etching a through hole into the insulating layer (oxide layer) down to the substrate at locations, which are not covered by the active semiconductor layer, forming a metal via by filling the through hole with a metal layer that is bordered by the insulating layer, forming a passivation layer that is worked through at the metal via, depositing a further metal layer and if necessary patterning the same within the area of the device structures, said metal layer providing the electric contact to the structures prepared on the front side in the active semiconductor layer, and forming a further passivation layer. By way of still further example, the invention includes forming at least one via opening in an insulating layer at locations that lack an active semiconductor layer, said via opening extending to the substrate, forming a metal via by filling the via opening with metal that is substantially bordered by said insulating layer, forming a first passivation layer at the metal via, which layer is worked through or intercepted, forming a metal layer on said passivation layer, and forming a further passivation layer on said metal layer.

In this way, a via thus provides a connection of active structures located on the front side to the substrate. The connection may be provided as a single or a multiple connection, such as in the claimed layer stack, so that different device groups on the front side may be individually connected to the substrate.

Also, a connection of device structures from the front side with doped regions in the substrate is contemplated.

Formed on the insulating layer of the SOI wafer is at least one layer sequence consisting of respective two layers.

From these layers, a first passivation layer having an opening is located above the metal filling, above which a second layer is located as a metallization layer that is conductively connected to the metal filing and that provides electrical contact, that is, a conductive structure, to the substrate so as to contact or conductively connect to the substrate structures that are prepared on the front side of the SOI.

A multiple repetition results in a sequence of a respective passivation layer having an opening above the area of the metal filling, and of a respective metallization layer located above the passivation layer within the area of the metal filling.

An electrical contact is established between the substrate and the structures that are prepared from the front side of the wafer, so that the stack comprises different conductive height layers of several alternating metal and passivation layers, wherein the height layers have a different spacing with respect to the insulating layer.

Exemplary embodiments explain and complete the invention, wherein identical reference numerals denote identical elements.

BRIEF DESCRIPTION OF THE DRAWINGS

FIG. 3 depicts a further embodiment with an additionally indicated separate lateral connection on the substrate above the insulating layer 11, wherein the connection originates from the first metallization 70. The active structures on the front side are schematically illustrated at 40 and 50, which are in FIG. 1 not explicitly shown so as to clearly illustrate a substrate contact.

DETAILED DESCRIPTION OF THE PRESENT INVENTION

Figure 1:
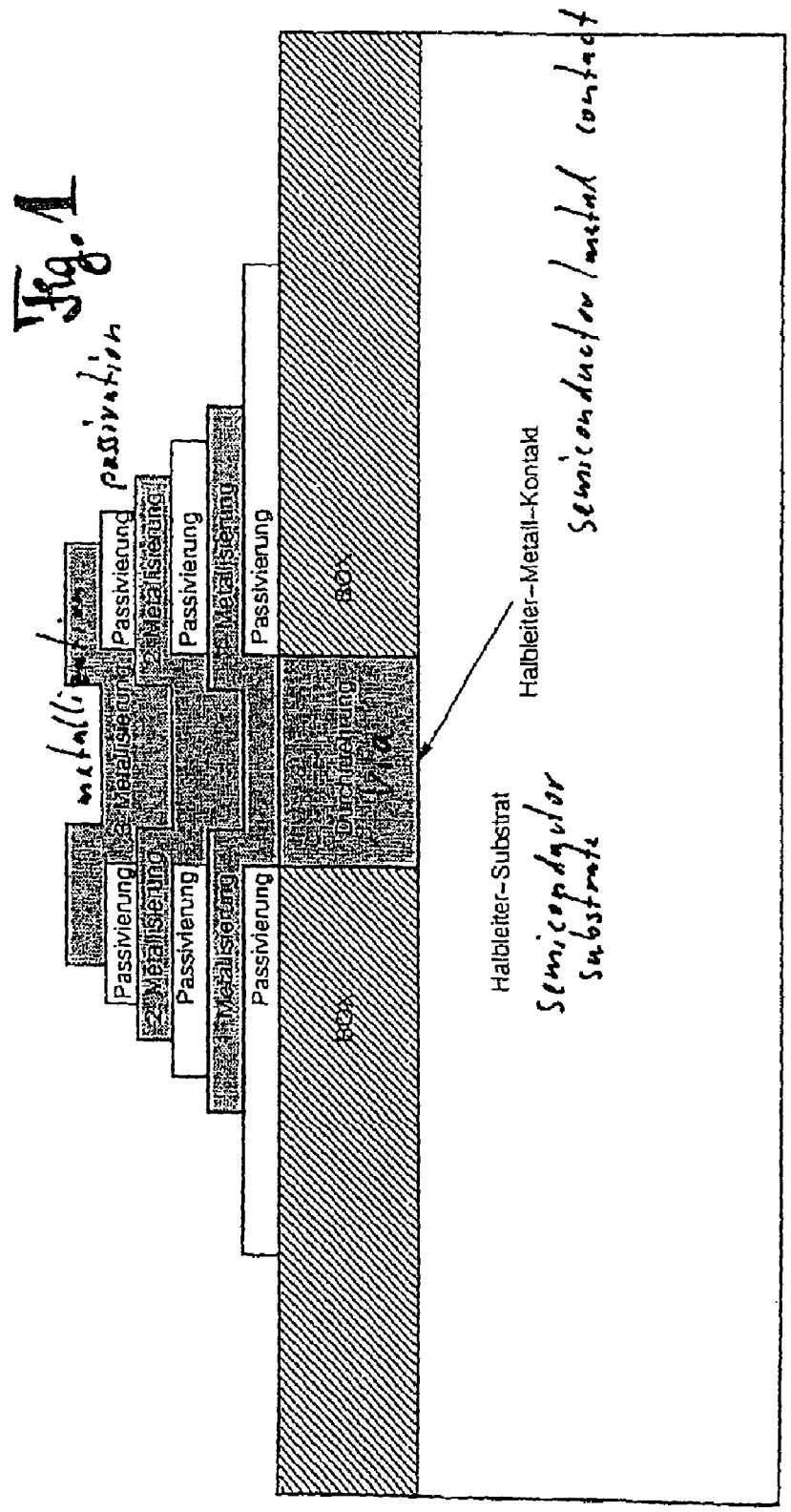
FIG. 1 illustrates a first embodiment in which a contact to a substrate is established via a layer stack.

For a more detailed explanation of the invention, FIG. 1 is provided, schematically showing the contacting of the substrate via a layer stack.

In this way, the via provides a connection of the active structures on the front side to the substrate. The connection may be provided as a single or a multiple connection, as is the case in the stack shown in FIG. 1, so that different device groups on the front side may be individually connected to the substrate. Also, the connection with the substrate of device structures on the front side and having doped regions is feasible.

With the reference numerals provided in FIG. 1, this figure is self-explanatory and no further explanation is necessary.

A contact is formed at the interfaces between the metal of the via and the substrate. This contact may represent an ohmic contact or a Schottky contact. Both types of contacts are of technological relevance and may be specifically implemented.

The contacting of the substrate according to FIG. 1 is also illustrated in FIG. 3. The arrangement is identical. The additional reference numerals are provided for a detailed explanation of the layer stack, which is provided at each via 19, 20. The contacting of the substrate is obtained in the same way as in FIG. 1, that is, by the layer stack 80 comprised of a plurality of layers, which includes in this example six layers. The via 20 is a metallic filling of an opening or a through hole 19 in the insulating layer 11 that, in turn, is a component of an SOI wafer 10. The substrate 13 bears the insulator 11, for instance, in the form of a BOX layer. Located above the insulator 11 is a semiconductor layer 12, which is already illustrated as a patterned layer and which is depicted in the left and right peripheral area as a patterned residual layer 12' and 12" for receiving, at least partially, active devices. These devices are symbolically indicated at 40 and 50 and are located at the left side and the right side of the layer stack 80, which is located in an area that lacks the single crystalline semiconductor layer 12. This area is indicated as 12a, wherein the entire single crystalline semiconductor layer 12 results in the residual layers 12' and 12" by patterning this area, i.e., the area 12a, lacking the semiconductor layer.

The via 19 in the form of, for instance, an etched through-hole, is filled with a metal material for forming a metal layer (or a metal plug), which is substantially flush with the insulating layer on the upper side and lower side or which lands on the substrate layer 13 at the lower side.

In this way, the via represents a connection of active structures 40, 50 on the upper side (front side V) of the SOI wafer to the substrate 13 that has a back side R.

This via may be formed as an individual one or as multiple vias, as is shown for the stack in FIG. 1. In this way, different device groups on the front side may individually be connected to the substrate. Different devices (or device groups) may also be connected to the same via or conductive connection 20 so as to conductively connect a plurality of devices with the same substrate location at the same via 19/20.

Figure 2:
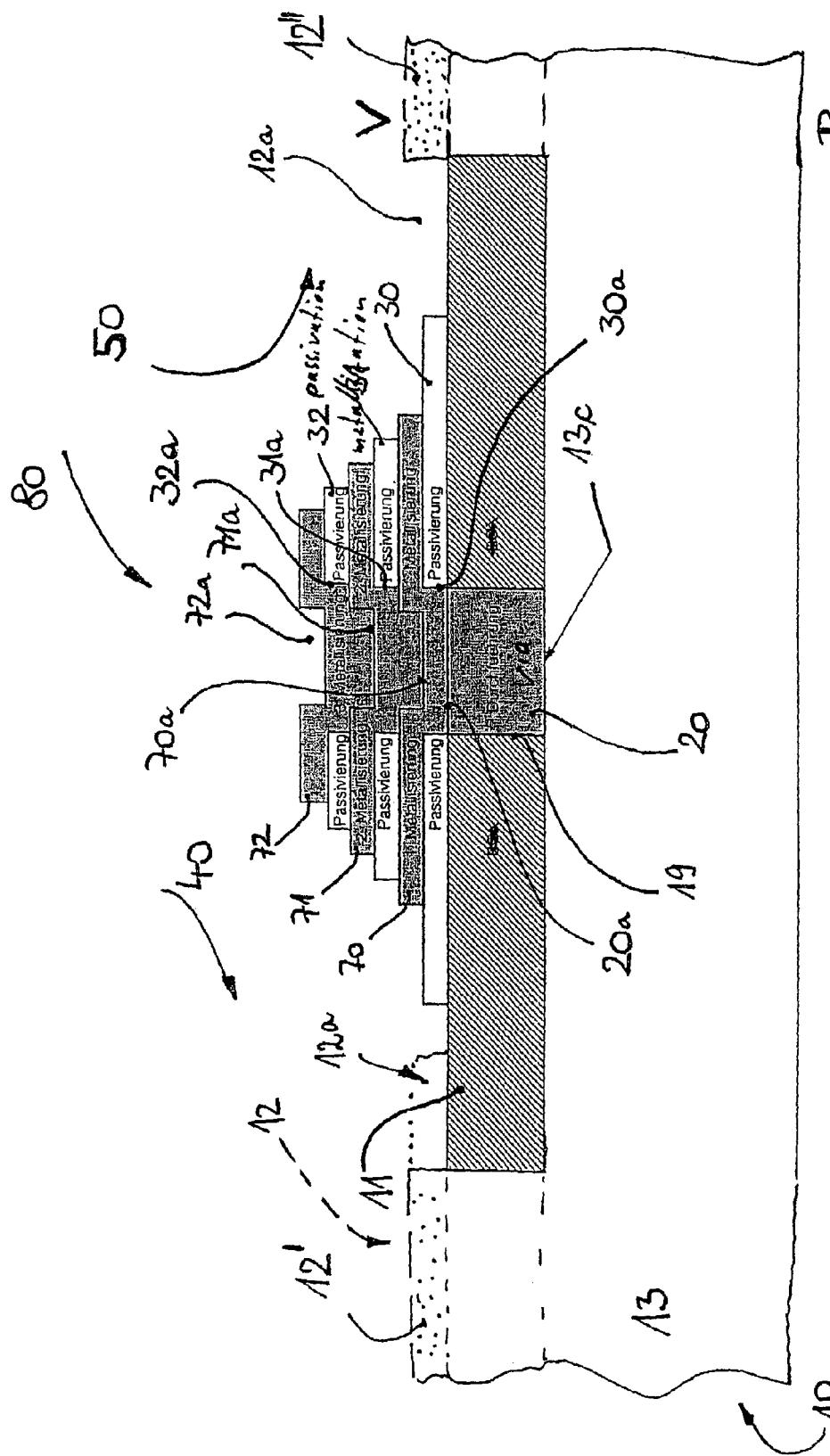
FIG. 2 illustrates the embodiment of FIG. 1 with explanatory reference numbers.

Doped regions, which are not explicitly shown, may be provided on the surface of the substrate in the via opening 19. If a doped region is not provided, a Schottky contact 13c is created, as is illustrated in FIG. 2. With a doped region having a p- or an n-doping, an ohmic contact to the substrate 13 is formed. This boundary area is referred to as "interface" between the metal of the via and the substrate.

The layer sequence 30 to 32, i.e., interleaved therein the layers 70 to 72, will be explained below.

In one manufacturing method, the stack structure of the layers according to FIG. 2 is obtained. The substrate contact 20 is formed to the front side and is there provided as a stack so as to allow to metallically contact the stack in different levels at different heights or spacing with respect to the insulating layer 11. These different levels are each spaced apart by a thickness of a passivation layer 70, 71, 72, which are provided in an alternating fashion within the stack and which comprise a via opening through which the metallic conductor 20 is established by the metallization layers 70, 71, 72 so that a central or inner via through the stack is formed, which is located above the via opening 19 and which is completely filled in a metallic conductive manner.

At locations that are not covered by the active semiconductor layer 12, i.e., the trench 12a, the insulating layer is provided with the via opening 19, particularly by an etch process, wherein the via opening extends to the substrate 13. A plurality of openings may be etched substantially simultaneously in a spaced apart relationship.

A metal via 20 is formed by filling in the respective via opening 19. The metal via is substantially flush with the insulating layer.

Above the metal via 20 a worked through passivation layer 30 is deposited as a first passivation that has a lateral extension and that is formed on the insulator 11. In a further process step, a metal layer 70 is formed, which reaches through the opened passivation layer at the worked through portion and that electrically contacts the metal layer 20 in the via opening, as is shown at 70a. The contact area 20a exhibits a recess, which substantially corresponds to the shape or extension of the worked through portion extending through the passivation layer 30.

If necessary, the first metal layer 70 may be patterned so as to provide the electrical contact within the area of the device structures. This is illustrated by means of the lateral conductor 70a, originating from the first metallization 70, in FIG. 3, representing a further embodiment. The laterally extending conductor 70a connects to the structure 40 prepared in the active semiconductor layer 12'. This lateral connection extends on the first level (height level) above the surface of the insulating level 11.

A further passivation layer 31 is formed on the metallization 70 and is also opened as is the case for the first passivation layer 30.

The described sequence of layer pairs formed of a passivation and a metallization may be repeated several times, for instance, the second passivation 31 and the second metallization 71. A third passivation 32 and a third metallization 72 may follow, as is illustrated in FIG. 2.

The passivation is worked through within the area above the metallic via 20 in order to form a central or inner core of metallic material for the conductive connection even of the uppermost metallization layer 72 to the substrate 13, that is, to the ohmic or Schottky contact 13c.

In the lateral direction, the further away the passivation layers are spaced from the insulating layer 11, the more they are reduced. The stack tapers in the upward direction, as is evident from the section of FIGS. 1 to 3.

In FIG. 3, in a further embodiment, there is shown an assumed metal conductor 72b at the third level, which extends to a further structure 50 prepared in the active semiconductor layer 12" and there the conductor establishes an electric contact similar to the conductor 70a laterally extending to provide contact to the first structure 40 prepared on the closed height level.

The various electric conductors are connected via the stacked metallization and from different levels so as to commonly electrically contact them with the substrate 13 by means of the via 19/20.

In a plan view, the described structures and, in particular, the stack structure 80, is not provided in a circular form in its outer extension but, instead, is preferably of rectangular or square shape.

A plurality of the described stack structures may be arranged within areas, which are not covered by the active semiconductor layer, and which correspond to the "trench" 12a.

We claim:

1. Substrate contacts extending to the front side of silicon-on-insulator semiconductor wafers, which are comprised of a thin monocrystalline silicon layer located on a thin insulating layer, wherein this double layer is carried by a monocrystalline semiconductor substrate, and the insulating layer comprises at least one through hole in an area lacking the monocrystalline semiconductor layer, said at least one through hole extends to the substrate and is filled with metal as metal filling, and at least one layer stack is located on the insulating layer, comprised of two respective layers, wherein the first layer represents a passivation layer having an opening above the area of the metal filling, above which the second layer as a metallization layer is located, that is connected to the metal filling and that provides the electric contact between the substrate and active structures prepared on the wafer front side.

2. The substrate contacts extending to the front side according to claim 1, wherein the insulating layer is a silicon dioxide layer.

3. The substrate contacts extending to the front side according to claim 1, wherein the passivation layer is a silicon nitride layer.

4. The substrate contacts extending to the front side according to claim 3, wherein the substrate is comprised of a highly doped monocrystalline silicon wafer.

5. The substrate contacts extending to the front side according to claim 1 wherein the metal filling forms an ohmic contact with the substrate.

6. The substrate contacts extending to the front side according to any of claim 1, wherein the metal filling forms a Schottky contact with the substrate.

7. A silicon-on-insulator semiconductor wafer having at least one substrate contact extending to the front side, wherein said wafer has a patterned monocrystalline semiconductor layer located on an insulating layer wherein the layers are carried by a monocrystalline semiconductor substrate, wherein
   (i) the insulating layer comprises worked through portions in areas not covered by the monocrystalline semiconductor layer, said worked through portions extending to the substrate and being filled with a metal,
   (ii) at least one layer sequence is formed on said insulating layer, the layer sequence being comprised of two respective layers;
   (iii) from the layers a first one is a passivation layer having an opening above the metal filling, above which is located a second layer as a metallization layer, which is conductively connected to the metal filling and which provides electrical contact or a conductive structure to the substrate so as to contact or conductively connect structures (40, 50) prepared on the front side with the substrate.

8. The semiconductor wafer of claim 7, wherein the insulating layer is a silicon dioxide layer.

9. The semiconductor wafer of claim 7, wherein the passivation layer is one of a silicon nitride layer and a plasma nitride layer.

10. The semiconductor wafer of claim 9, wherein the substrate is comprised of highly doped monocrystalline silicon.

11. The semiconductor wafer according to claim 7, wherein the metal filling forms an ohmic contact with said substrate.

12. The semiconductor wafer according to claim 7, wherein the metal filling forms a Schottky contact with said substrate.

13. The semiconductor wafer of claim 7, wherein the layer sequence is provided at least two times as a stack.

14. The semiconductor wafer of claim 7, wherein the layer sequence is provided at least three times for forming a layer stack having a metallic vertical core.

15. The semiconductor wafer of claim 7, wherein a geometry of the perimeter of the layer sequence has a polygonal configuration.

16. The semiconductor wafer of claim 7, wherein the layers of a respective layer sequence are substantially planar.

17. Silicon-on-insulator wafer having substrate contacts extending to a front side of the silicon-on-insulator semiconductor wafer, comprising:
    a monocrystalline silicon layer located on an insulating layer to form a double layer carried by a monocrystalline semiconductor substrate, the insulating layer comprises at least one through hole in an area lacking the monocrystalline semiconductor layer;

the at least one through hole extends to the substrate and is filled with a metal as a metal filling; and at least one layer stack, located on the insulating layer, comprises at least two further layers, in which a first layer of the at least two further layers represents a passivation layer having an opening above the metal filling, and in which a second layer of the at least two further layers comprises a metallization layer located above the first layer of the at least two further layers and connecting to the metal filling, to provide an electric contact between the substrate and structures prepared on the silicon-on-insulator wafer front side, wherein the substrate contacts extend to the front side, and wherein the metal filling forms at least one Schottky contact with the substrate.

* * * * *